US006801558B2

(12) United States Patent
Burak

(10) Patent No.: US 6,801,558 B2
(45) Date of Patent: Oct. 5, 2004

(54) MATERIAL SYSTEMS FOR LONG WAVELENGTH LASERS GROWN ON INP SUBSTRATES

(75) Inventor: Dariusz Burak, Fremont, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 53 days.

(21) Appl. No.: 10/173,369

(22) Filed: Jun. 14, 2002

(65) Prior Publication Data

US 2003/0231680 A1 Dec. 18, 2003

(51) Int. Cl.$^7$ ................................................. H01S 5/00
(52) U.S. Cl. ............................ 372/43; 372/44; 372/45; 372/46
(58) Field of Search ..................................... 372/43–50

(56) References Cited

U.S. PATENT DOCUMENTS

| | | | | |
|---|---|---|---|---|
| 5,251,225 A | * | 10/1993 | Eglash et al. .................. | 372/45 |
| 5,625,635 A | * | 4/1997 | Kurtz et al. .................. | 392/45 |
| 5,825,796 A | * | 10/1998 | Jewell et al. .................. | 372/45 |
| 6,356,572 B1 | * | 3/2002 | Tanaka et al. ................ | 372/45 |
| 2002/0101894 A1 | * | 8/2002 | Coldren et al. ............... | 372/43 |
| 2002/0195597 A1 | * | 12/2002 | Choa ........................... | 257/14 |

OTHER PUBLICATIONS

T. Anan, M. Yamada, K. Nishi, K. Kurihara, K. Tokutume, A. Kamei, and S. Sugou; "Continuous–Wave Operation of 1.30 um GaAsSb.GaAs VCSELs", Electronic Letters, Apr. 26, 2001, vol. 37, No. 9, pp 566.*

L. Coldren, "Long–Wavelength VCSELs: The Case for All–Epitaxial Approaches", 2000 IEEE 17th International Semiconductor Laser Conference, Monterey, Sep. 25–28, 2000, p. 1, paper No. MA1.*

S.K. Mathis, K.H. A. Lau, A.M. Andrews and E. M. Hall, "Lateral oxidation kinetics of AlAsSb and related alloys lattice matched to InP", Journal of Applied Physics, vol. 89, No. 4 Feb. 15, 2001 p. 2458.

T. Anan, M. Yamada, K.Nishi, K. Kurihara, K. Tokutume, A. Kamei and S. Sugou,; "Continuous–wave operation of 1.30 um GaAsSb.GaAs VCSELS", Electronics Letters,Apr. 26, 2001 vol. 37, No. 9 p. 566.

I. Vurgaftman, J.R. Meyer and L.R. Ram–Mohan,"Band parameters for III–Vcompound semiconductors and their alloys", Journal of Applied Physics, Jun. 1, 2001, vol. 89, No. 11 p. 5815.

L. Coldren, "Long–wavelength VCSELs; The Case for All–Epitaxial Approaches", 2000 IEEE 17th International Semiconductor Laser Conference, Monterey, Sep. 25–28, 2000, p. 1, paper No. MA1.

G. Steinle, H. Riechert and A. Yu Egorov, "Monolithic VCSEL with InGaAsN active region emitting ar 1.28 um and CW output power exceeding 500 u W at room temperature", Electronic Letters, Jan. 18, 2001 vol. 37, No. 2 p. 93.

(List continued on next page.)

*Primary Examiner*—Don Wong
*Assistant Examiner*—Leith A Al-Nazer
(74) *Attorney, Agent, or Firm*—Judy L. Shie

(57) ABSTRACT

A vertical cavity surface emitting laser (VCSEL) capable of producing long-wavelength light has a substrate of InP and an active region with alternating quantum wells and barrier layers. The target wavelength range is preferably between 1.2–1.4 um. The quantum well is made of AlGaAsSb or GaAsSb, and the barrier layers are made of AlGaAsSb, AlInGaAs, or AlInAs. The active region is sandwiched between two mirror stacks that are preferably epitaxially grown Distributed Bragg Reflectors. The active region has large conduction and valence band offsets ($\Delta E_c$ and $\Delta E_v$) for effective carrier containment over the wide range of ambient temperatures in which the VCSEL is expected to function. The active region can be designed to have little or no lattice strain on the InP substrate.

17 Claims, 5 Drawing Sheets

OTHER PUBLICATIONS

A.W. Jackson, R.L. Naone, M.J. Dalberth, J.M. Smith, K.J. Malone, D.W. Kisker, J.F. Klem, K.D. Choquette, D.K. Serkland and K.M. Geib, "OC–48 capable InGaAsN vertical cavity lasers", Electronics Letters, Mar. 15, 2001 vol. 37, No. 6 p. 335.

D.I. Babic, J. Piprek and J.E. Bowers, "Long–wavelength vertical–cavity lasers", in C.W. Wilmsen, H. Temkin and L.A. Coldren (Eds.) "Vertical–cavity surface–emitting lasers", Cambridge University Press, Cambridge, UK, 1999.

E. Hall, S. Nakagawa, J.K. Kim and L.A. Coldres, "Room–temperature, CW operation of lattice–matched long–wavelength VCSELs", Electronics Letters, vol. 36, p. 1465 (2000).

F. Genty, G. Almuneau, L. Chusseau, A. Wilk, S. Gaillard, G. Boissier, P. Grech and J. Jacquet, "Growth and characterization of vertical cavity structures on InP with GaAsSb/AlAsSb Bragg mirrors for 1.55um emission", J. Crystal Growth, vol. 201/201, p. 1024 (1999).

* cited by examiner

QUANTUM WELL WIDTH = 100 ANGSTROMS
y_w & y_b SELECTED TO LATTICE MATCH TO InP

QUANTUM WELL WIDTH = 100 ANGSTROMS
y_w & y_b SELECTED TO LATTICE MATCH TO InP

MATERIAL SYSTEMS FOR LONG WAVELENGTH LASERS GROWN ON INP SUBSTRATES

FIELD OF THE INVENTION

The invention is directed towards the field of lasers, and more specifically, towards alloys that can be used in the active region of a laser.

BACKGROUND OF THE INVENTION

Vertical cavity surface emitting lasers (VCSELs) are commonly used as light sources in optical communication systems. FIG. 1A shows a diagram of a prior art VCSEL 101, based on a gallium arsenide (GaAs) substrate 102. VCSEL 101 emits light at 850 nm. Two mirror stacks 103, one adjacent to the substrate 102 and one at the top of the VCSEL 101, reflect the laser light within the VCSEL 101. The mirror stacks 103 are typically Distributed Bragg Reflectors (DBRs) made of alternating layers of $Al_xGa_{1-x}As$ and $Al_yGa_{1-y}As$, where "x" and "y" denote the molecular fractions of Al in high and low refractive index layers, respectively. A cladding layer 107 is adjacent to each mirror stack 103. Although each cladding layer 107 is illustrated as a single layer, it may be composed of many different layers. The cladding layer 107 may also be called a spacer, and is used to pad the size of an active region 109 so that the VCSEL 101 will work properly. Sandwiched between the mirror stacks 103 and cladding layers 107 is the active region 109, comprising interleaved layers of quantum wells 111 and barrier layers 113. The quantum wells 111 have a width w. The quantum wells 111 are typically GaAs, and the barrier layers 113 are typically AlGaAs. Hereinafter, VCSELs shall be referred to by the composition of their active region. Therefore, the VCSEL 101 can be identified as a GaAs/AlGaAs VCSEL, or alternatively as a VCSEL with a GaAs/AlGaAs active region.

FIG. 1B shows an energy-band diagram identifying selected band parameters for the active region 109 of the VCSEL 101 shown in FIG. 1A. The conduction band is labeled $E_c$ and the valence band is labeled $E_v$. The difference between the conduction band $E_c$ and the valence band $E_v$ is known as a band gap. The band gap of the quantum well 111 is labeled $Eg^{QW}$. The band gap of the barrier layer 113 is labeled $Eg^B$. The difference between the conduction bands $E_c$ of the quantum well 111 and the barrier layer 113 is known as the conduction band offset, labeled $\Delta E_c$. The difference between the valence bands $E_v$ of the quantum well 111 and the barrier layer 113 is known as the valence band offset, labeled $\Delta Ev$. Electrons and holes (collectively known as carriers) are injected into the quantum well 111 and confined by the barrier layers 113 when the VCSEL is forward biased. Ideally, the materials used in the quantum wells 111 and barrier layers 113 have a relatively large $\Delta E_c$ and $\Delta E_v$ to provide effective carrier confinement in the quantum well 111. In a typical GaAs/AlGaAs VCSEL 101, $\Delta E_c \approx 150$ meV and $\Delta E_v \approx 75$ meV. Note that $\Delta E_c$ is twice $\Delta E_v$; a 2:1 ratio between $\Delta E_c$ and $\Delta E_v$ is often considered indicative of a well-balanced material system.

Carriers inside the quantum well 111 actually acquire a slight amount of energy as a result of their confinement, effectively increasing the quantum well bandgap $Eg^{QW}$ by the energy of quantum confinement $dE_{qc}$ (not shown). $dE_{qc}$ is a function of the quantum well width w, increasing as w is decreased. When the active region 109 is not lattice-matched to the substrate 102, the carriers within the quantum well acquire an additional energy due to lattice strain $dE_{strain}$ (not shown). Although the band parameters described above refer specifically to the active region 109 of the VCSEL 101, the terms are equally applicable to the active region of any laser.

Light is emitted from the quantum well 111 when electrons drop from the conduction band $E_c$ to the valence band $E_v$. The wavelength of light emitted is determined approximately by the formula:

$$\lambda_{um} \approx \frac{1.24 \text{ eV}}{Eg^{QW} + dE_{qc} + dE_{strain}} \quad \text{(Equation 1)}$$

In Equation 1, $Eg^{QW}$ is the greatest contributing factor in determining the wavelength, as it is typically much larger than $dE_{qc}$ or $dE_{strain}$. The material used for the quantum well 111 should be selected to have a band gap $Eg^{QW}$ that will produce light within the desired range of wavelengths. The quantum well width w and lattice strain on the substrate 102 will also be a consideration because of $dE_{qc}$ and $dE_{strain}$.

GaAs/AlGaAs is ideal for the active region in a GaAs-substrate VCSEL for several reasons. First, (Al)GaAs/AlGaAs can be used to implement both the mirror stacks 103 and the active region 109, thus simplifying the manufacturing process because there is no need to change the growth conditions. Second, mirror stacks 103 using AlGaAs/AlGaAs can be epitaxially grown on the GaAs substrate 102, which results in a VCSEL that is entirely grown epitaxially. Since fully-epitaxial VCSELS are easier to manufacture and process, they are preferred over VCSELS having mirror stacks formed with other methods such as fusion bonding or deposition. Third, GaAs/AlGaAs VCSELs can be oxidized. Oxidized layers are often used in a VCSEL to electrically confine carriers and optically confine the laser beam, which leads to improved electro-optical performance of the device.

One final reason that GaAs/AlGaAs VCSELs work well is due to their low sensitivity to temperature. A VCSEL typically has to maintain performance within an operating temperature range between 0–100° C. One parameter used to measure temperature sensitivity is known as the characteristic temperature $T_0$. $T_0$ is usually determined for broad area lasers (also known as edge-emitting lasers), not for VCSELs. However, the $T_0$ of an edge-emitting laser built with a given active region is still a useful indicator of how that same active region will perform with temperature changes in a VCSEL. A high characteristic temperature $T_0$ is preferable because it means the laser is less sensitive to temperature fluctuations. An edge-emitting laser built with a GaAs/AlGaAs active region typically has a characteristic temperature $T_0$ around 150K, which is relatively high. The characteristic temperature $T_0$ is also related to $\Delta E_c$ and $\Delta E_v$—an active region with large $\Delta E_c$ and $\Delta E_v$ will likely exhibit high $T_0$ and low threshold current density, provided that the material quality is good.

The light emitted from a GaAs/AlGaAs VCSEL typically has a wavelength around 850 nm, which has a transmission range of 200–500 m in multimode fiber, depending on the speed of the optical link. Currently, the challenge facing the optical communications industry is creating a VCSEL capable of emitting light with a longer wavelength, which can travel longer distances along a single-mode optical fiber. The preferable target wavelength range is between 1.2 um and 1.4 um, or more specifically, 1260–1360 nm, which would produce transmission ranges of 2–40 km. The ideal long-wavelength VCSEL would possess the same qualities as a GaAs/AlGaAs VCSEL (i.e. epitaxially grown mirrors, active regions that are lattice matched to the substrate, good carrier containment, low sensitivity to temperature changes, etc) except with a longer wavelength of emitted light.

Several material systems have been proposed that would emit light within the target range. One approach is using InGaAsN/GaAs or InGaAsN/GaAsN (hereinafter collectively referred to as InGaAsN/GaAs(N)) in the active region on a GaAs substrate. InGaAsN/GaAs(N) has acceptable performance over the desired temperature range. Unfortunately, although InGaAsN/GaAs(N) can be epitaxially grown on the GaAs substrate, the lattice structure does not match well to the GaAs substrate and introduces a compressive strain of 3% or more. Such a large strain may cause undesirable reliability problems in a VCSEL.

Another approach to long-wavelength VCSELs involves using a substrate of indium phosphide (InP). InP has been researched extensively as a VCSEL substrate, and many materials have been identified that can form epitaxially-grown mirror stacks on InP. For example, InGaAsP/InP was a promising material system for VCSELs, since InGaAsP can be lattice-matched to the InP substrate and epitaxially grown to create mirror stacks. However, the small conduction band offset ($\Delta E_c$) in an InGaAsP/InP active region does not allow for effective electron confinement at elevated temperatures. Since VCSELs must operate over a wide range of temperatures up to 100° C., the InGaAsP/InP material system is not an ideal solution. Another drawback to the InGaAsP/InP material system is that it cannot be oxidized to create the desired optical and electrical confinement within the VCSEL.

AlInGaAs/AlInGaAs active regions grown on InP have also been investigated. However, the characteristic temperature of edge-emitting lasers made with AlInGaAs/AlInGaAs is only in the range of 100–120K. A higher characteristic temperature would be preferable to minimize the VCSEL's sensitivity to temperature changes. This is especially important since the thermal conductivity of epitaxial mirrors grown on InP substrates is known to be low.

Therefore, a need remains for a VCSEL long-wavelength material system that has relatively large band offsets ($\Delta E_c$ and $\Delta E_v$) for effective carrier confinement within the quantum wells in the temperature range of interest, with a lattice structure that substantially matches the substrate's lattice structure, and a relatively high characteristic temperature. Preferably, the mirror stacks of the VCSEL can be epitaxially grown on the substrate. It would also be preferable that the mirrors can be oxidized, since oxidation is an effective way to provide electrical and optical confinement of currents and optical beams.

SUMMARY OF THE INVENTION

In accordance with an illustrated preferred embodiment of the present invention, a VCSEL based on an InP substrate is disclosed. The VCSEL has a first mirror stack and second mirror stack, the first mirror stack adjacent to the substrate. Sandwiched between the two mirror stacks are two cladding layers. Sandwiched between the two cladding layers is an active region. The mirror stacks are preferably grown epitaxially, although other methods of fabricating the mirror stacks are acceptable. The active region uses AlGaAsSb quantum wells interleaved with barrier layers of AlGaAsSb, AlInGaAs, or AlInAs. Alternatively, the active region of the VCSEL can comprise quantum wells of GaAsSb interleaved with barrier layers of AlGaAsSb, AlInGaAs, or AlInAs.

As will be discussed in the following section, the present invention advantageously provides an active region that not only emits light within the desired long-wavelength range, but also has a substrate-matching lattice structure. Furthermore, the present invention provides effective carrier containment over the entire operating temperature range. This is a combination of features not available in the prior art.

Further features and advantages of the present invention, as well as the structure and operation of preferred embodiments of the present invention, are described in detail below with reference to the accompanying exemplary drawings. In the drawings, like reference numbers indicate identical or functionally similar elements.

DETAILED DESCRIPTION

Figure 1A:
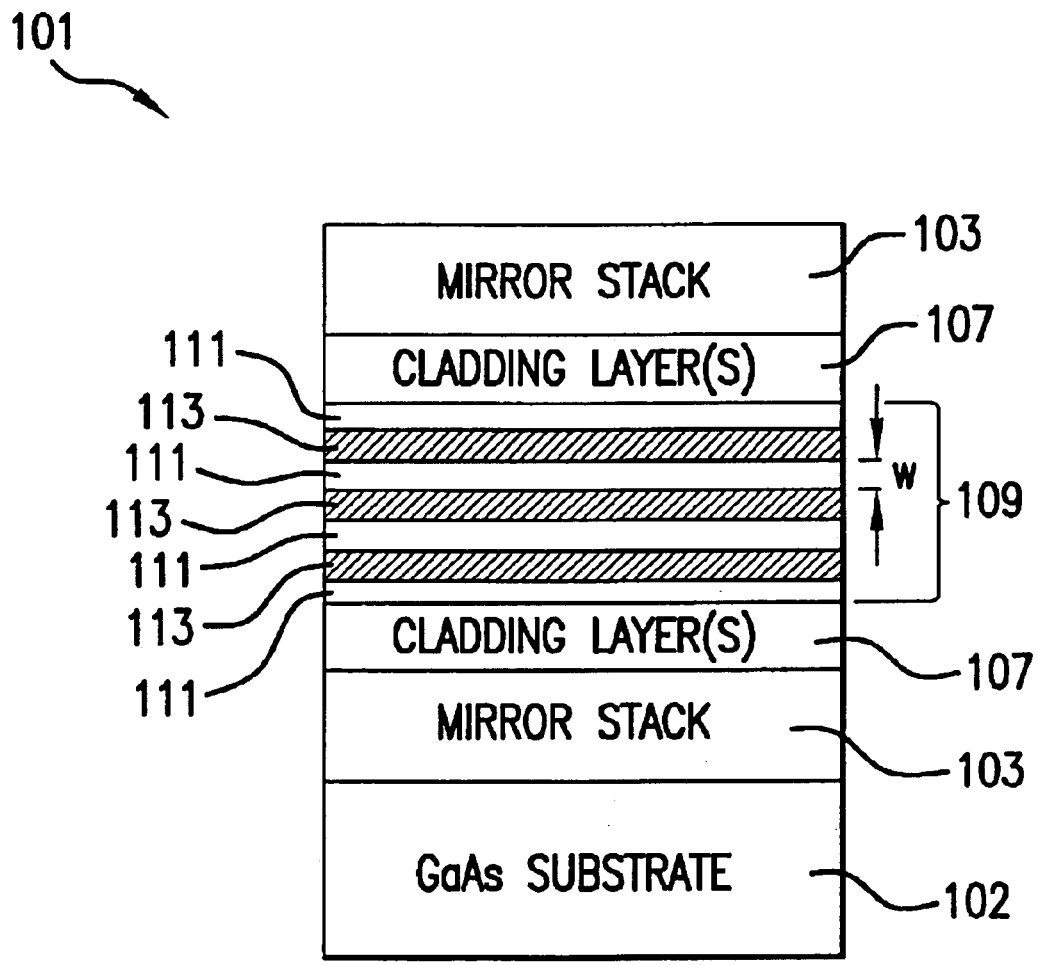
FIG. 1A is a simplified cross-sectional side view of a prior art VCSEL based on a GaAs substrate.
Figure 1B:
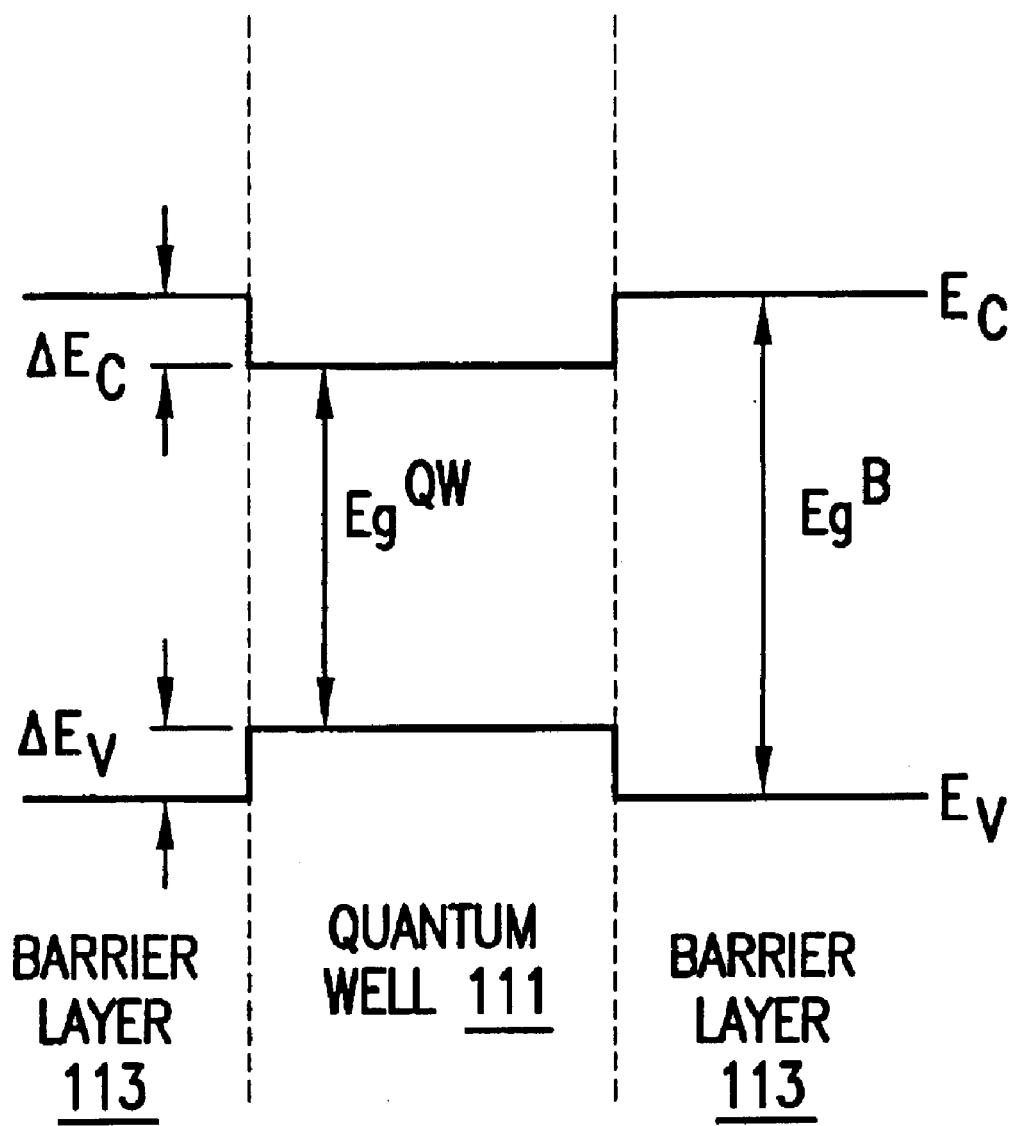
FIG. 1B shows an energy-band diagram for the active region of the VCSEL shown in FIG. 1A.
Figure 2:
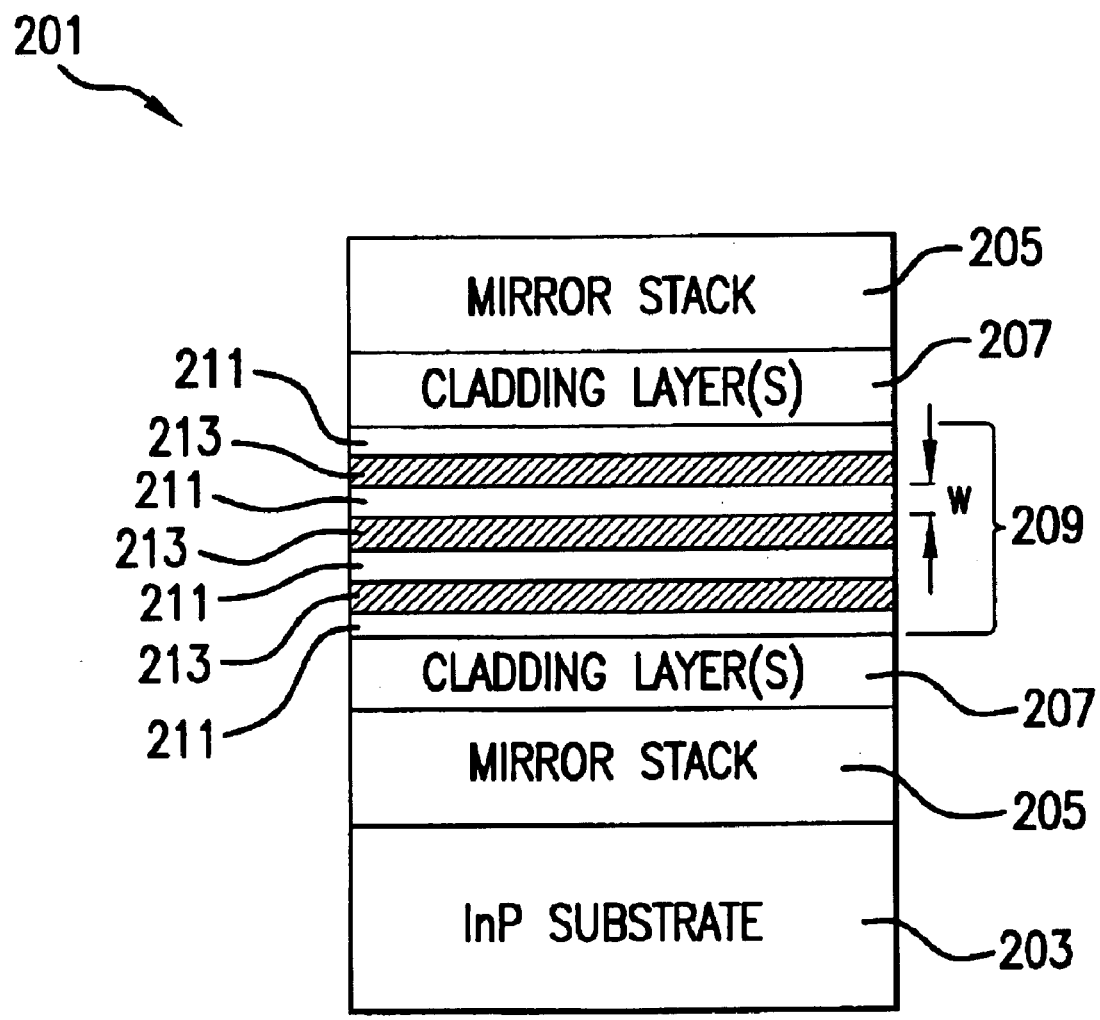
FIG. 2 is a simplified cross-sectional side view of the present invention.

Referring to FIG. 2, a VCSEL 201 according to one embodiment of the present invention is illustrated. The VCSEL 201 is based on a substrate 203 of InP. The VCSEL 201 has a first mirror stack 205 and a second mirror stack 205, the first mirror stack 205 adjacent to the substrate. Preferably, the two mirror stacks 205 are epitaxially grown, although other methods such as fusion bonding, deposition of dielectric mirror, etc. are also acceptable. In between the two mirror stacks 205 are two cladding layers 207. The cladding layers 207 are also preferably epitaxially grown.

In between the two cladding layers 207 is an active region 209. The active region 209 includes alternating quantum wells 211 and barrier layers 213. The quantum wells are made of $Al_xGa_{1-x}As_ySb_{1-y}$ or $GaAs_xSb_{1-x}$, where x and y have values ranging from 0 to 1. The quantum wells have a width w. The barrier layers 213 can be made of $Al_sGa_{1-s}As_tSb_{1-t}$, $Al_sGa_tIn_{1-s-t}As$, or $Al_sIn_{1-s}As$, where and s and t have values ranging from 0 to 1. For ease of referral, the quantum well materials may be used without their subscripts as AlGaAsSb or GaAsSb. For ease of referral, the barrier layer materials may be used without their subscripts as AlGaAsSb, AlGaInAs, or AlInAs. The quantum wells 211 and barrier layers 213 can be either tensile or compressive strained, or lattice matched to the substrate. Although they are illustrated as equal in width in FIG. 2, the quantum wells 211 and barrier layers 213 can have different widths.

In a preferred embodiment, the first and second mirror stacks 205 are DBRs made of high and low refractive index layers of AlGaAsSb. AlGaAsSb is a preferred material for use in the mirror stacks 205 because it can be oxidized, a desirable quality as previously mentioned. Furthermore, AlGaAsSb is the same material system used to grow the active region 209, so there is no need to change the growth conditions when building the VCSEL. Other materials that may be used in the mirror stack 205 are well known in the art (such as AlInGaAs or GaInAsP) and also acceptable. The first mirror stack 205 does not have to made of the same materials as the second mirror stack 205. The mirror stacks 205 and cladding layers 207 are conventional structures common in VCSEL design. Various materials that have the appropriate reflective properties suitable for use in the mirror stacks 205 and cladding layers 207 are well known to persons skilled in the art, and thus will not be further discussed in detail here.

The band parameters of the alloys used in the quantum wells 211 and barrier layers 213 of the present invention are well known or can be easily interpolated from the known band parameters of binary compounds. (See "Band Parameters for III–V Compound Semiconductors and Their Alloys", Journal of Applied Physics, Volume 89, Number 11, 1 Jun. 2001, pages 5815–5875.) By using well known interpolating methods to deduce the band parameters of quaternary and ternary compounds, it can be determined which alloys posses the desired properties for a good material system in a long wavelength VCSEL.

Figure 3A:
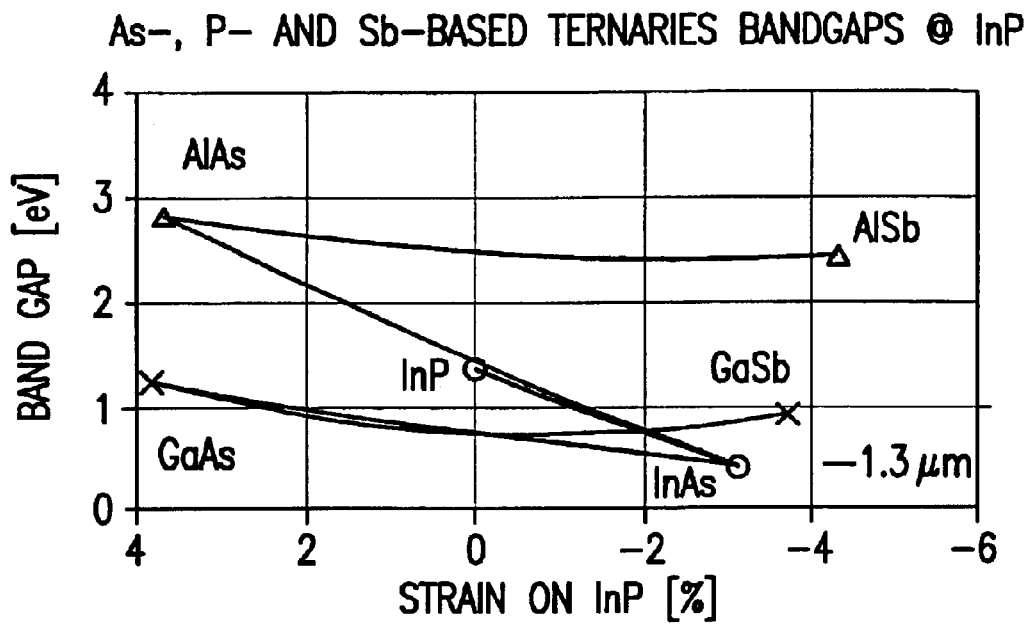
FIG. 3A is a plot of the band gap values for selected binary compounds against the lattice strain on an InP substrate.

FIG. 3A plots the band gaps for selected binary compounds against the lattice strain on an InP substrate for the VCSEL of FIG. 2. The lines connecting the binary compounds are interpolations that indicate the band gaps and lattice strain of ternary alloys. Similar interpolations can be performed to determine the characteristics of quaternary alloys; such interpolations are well known in the art and, as such, do not need to be described in detail here. A line delineating the band gap that produces a 1.3 um wavelength (the midpoint of the target 1.2 um–1.4 um range) is superimposed on the graph.

Suitable alloys for use in the quantum wells 211 of the present invention have band gaps $E_g^{QW}$ that produce light emissions in the desired range of wavelengths, as calculated by Equation 1. Such alloys can be identified from FIG. 3A. (Although not explicitly illustrated in FIG. 3A, the quantum confinement energy $dE_{qc}$ and lattice strain energy $dE_{strain}$ should also be factored into the calculations, as taught by Equation 1.) The alloys selected should be lattice matched or have very little strain on the InP substrate. Up to 3% strain may be acceptable, depending on the growth conditions and quality. As shown in FIG. 3A, quantum wells made of AlGaAsSb can be lattice matched to an InP substrate, and emit light within the desired range of wavelengths. However, AlGaAsSb is a quaternary alloy, and may be difficult to grow. If a larger strain (about 2% tensile or 3% compressive) can be tolerated on the substrate, quantum wells made of GaAsSb can also be designed to emit light within the desired range, as seen from FIG. 3A. GaAsSb is a ternary alloy, which may be easier to grow than a quaternary alloy.

Figure 3B:
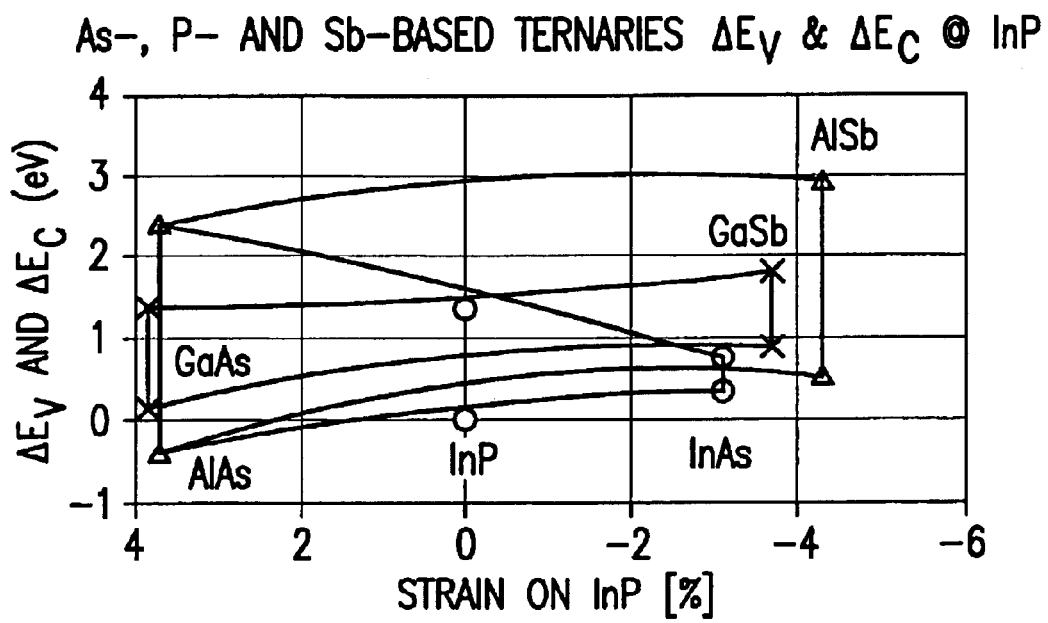
FIG. 3B plots conduction band offsets ($\Delta E_c$) and valence band offsets ($\Delta E_v$) for selected binary compounds against the lattice strain on an InP substrate.

FIG. 3B plots conduction band offsets ($\Delta E_c$) and valence band offsets ($\Delta E_v$) for selected binary compounds against lattice strain on an InP substrate. The lines connecting the binary compounds are interpolations that indicate the $\Delta E_c$ and $\Delta E_v$ of ternary alloys. Similar interpolations can be performed to determine the $\Delta E_c$ and $\Delta E_v$ of quaternary alloys; these interpolations are well known in the art and, as such, do not need to be described in detail here. A suitable pair of alloys for use in the present invention has a $\Delta E_c$ and $\Delta E_v$ that provides sufficient carrier confinement to guarantee device performance over the temperature range of interest, which is 0–100° C. For satisfactory operation over the desired temperature range, $\Delta E_c$ and $\Delta E_v$ for the selected alloys should preferably be equal to or greater than $\Delta E_c$ and $\Delta E_v$ for the GaAs/AlGaAs active region. Therefore, $\Delta E_c$ should be at least 150 meV, and $\Delta E_v$ should be at least 75 meV. The data in FIG. 3B indicates that an AlGaAsSb quantum well with an AlGaAsSb, AlInGaAs, or AlInAs barrier layer will fit these criteria. A GaAsSb quantum well with an AlGaAsSb, AlInGaAs, or AlInAs barrier layer will also fit these criteria. Since $\Delta E_c$ and $\Delta E_v$ for these active regions is at least equal to or greater than the $\Delta E_c$ and $\Delta E_v$ of the GaAs/AlGaAs active region, the characteristic temperature $T_0$ of these active regions should also be at least as high, if not higher than the characteristic temperature $T_0$ of the GaAs/AlGaAs active region, provided that the material quality is comparable.

Figure 4A:
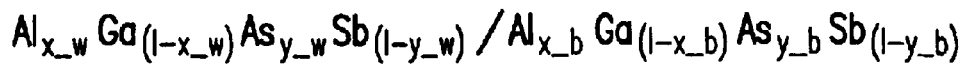
FIG. 4A plots the first electron-heavy-hole (E-HH1), the first electron-light-hole (E-LH1), and the second electron-heavy-hole (E-HH2) transitions for an AlGaAsSb/AlGaAsSb active region as a function of Al composition in the quantum well.
Figure 4A:
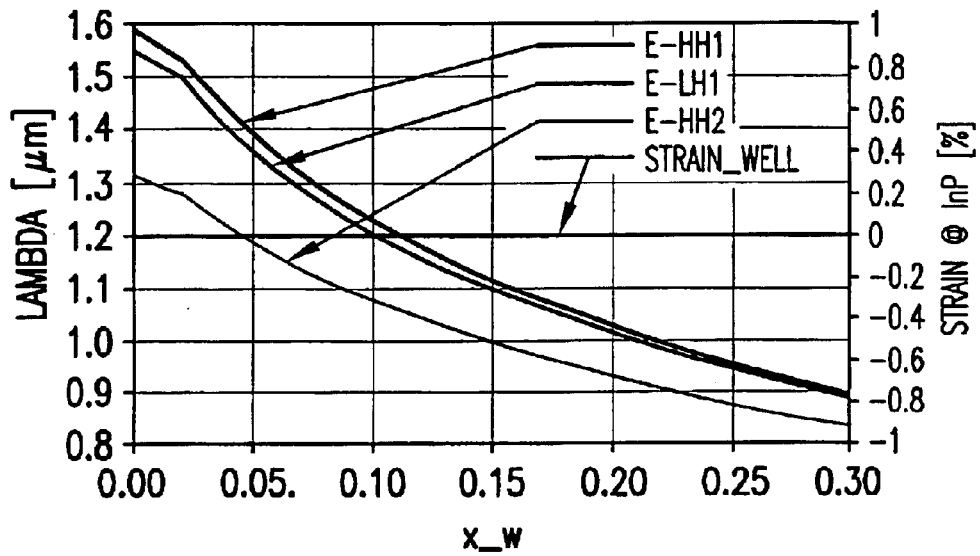
Figure 4B:
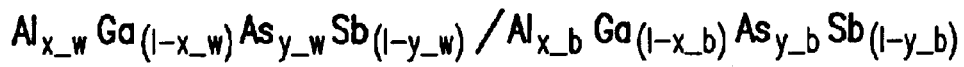
FIG. 4B plots the conduction band offset ($\Delta E_c$), valence band offset ($\Delta E_v$), quantum confinement energy $dE_{qc}$, and lattice strain energy $dE_{strain}$ as a function of Al composition in the quantum well for an AlGaAsSb/AlGaAsSb active region.
Figure 4B:
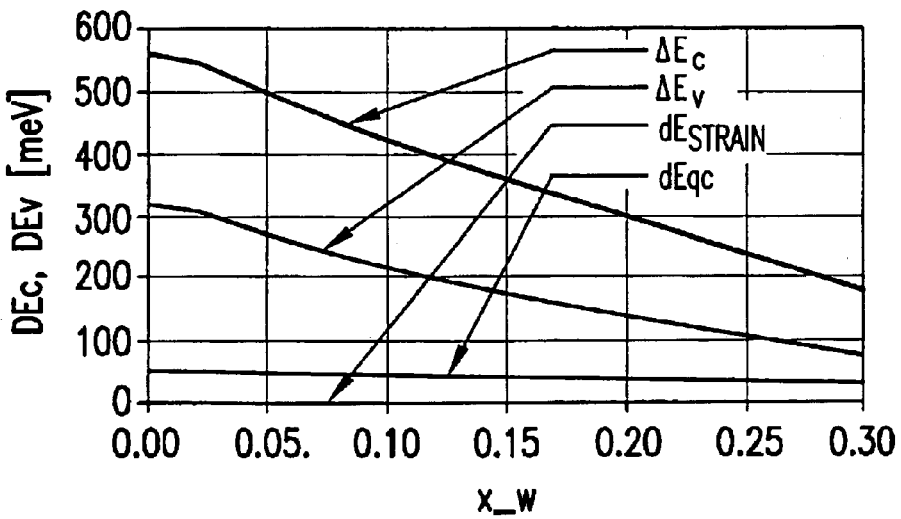

As discussed throughout, the ideal active region for a long-wavelength VCSEL should satisfy the following requirements: possess minimal lattice strain, emit light with a wavelength within the target range, and maximize carrier containment to maintain performance over the operating temperature range. FIGS. 4A–4B are graphs depicting the characteristics of a sample AlGaAsSb/AlGaAsSb active region that meets these requirements. FIG. 4A plots the first electron-heavy-hole (E-HH1), the first electron-light-hole (E-LH1), and the second electron-heavy-hole (E-HH2) transitions for an AlGaAsSb/AlGaAsSb material system, as a function of Al composition in the quantum well. FIG. 4B plots the conduction band offset ($\Delta E_c$), valence band offset ($\Delta E_v$), quantum confinement energy $dE_{qc}$, and lattice strain energy $dE_{strain}$ as a function of Al composition in the quantum well for the same material system described in FIG. 4A.

The alloy composition in the quantum well of the sample active region is represented by $Al_{x\_w}Ga_{1-x\_w}As_{y\_w}Sb_{1-y\_w}$; the alloy composition in the barrier layer is represented by $Al_{x\_b}Ga_{1-x\_b}As_{y\_b}Sb_{1-y\_b}$. For the purposes of this example, the molecular fractions of As (as indicated by the variables y_w and y_b) have been set to lattice match the active region to the InP substrate. In material systems that cannot be lattice matched to the substrate, the lattice strain should be reduced as much as possible. Additionally, the quantum well width w has been set at 100 Å, and the percentage of Al in the barrier layer has been set at 47% (x_b=0.47).

The wavelength of emitted light in the sample AlGaAsSb/AlGaAsSb active region is controlled by the amount of Al (as indicated by the variable x_w) in the quantum well. As can be seen from FIG. 4A, increasing the amount of aluminum in the quantum well decreases the wavelength of emitted light. The wavelength of the emitted light can thus be controlled by varying the amount of Al in the quantum well. Since the quantum well is designed to be lattice matched to the InP substrate, the strain on the substrate (represented by the line strain_well) remains 0% for any value of x_w, as can be seen in FIG. 4A. Likewise, the lattice strain energy $dE_{strain}$ remains 0 for any value of x_w, as can be seen in FIG. 4B. The quantum well width w has been fixed at 100 Angstroms in this example, but the width of the quantum well can also be varied (affecting the quantum confinement energy $dE_{qc}$ shown in FIG. 4B) to modify the emission wavelength.

$\Delta E_c$ and $\Delta E_v$ should be maximized to get the most effective carrier containment. In the example of FIGS. 4A–4B, the percentage of Al in the barrier layer (represented by the variable x_b) is fixed at 0.47 to maximize $\Delta E_c$ and $\Delta E_v$. 47% Al is the largest amount of Al that allows the AlGaAsSb barrier layer to remain lattice matched to the InP substrate. However, $\Delta E_c$ and $\Delta E_v$ can be tailored by adjusting the Al composition in the barrier layer. As can be seen from the FIG. 4B, with 0 to 30% aluminum in the quantum well, the AlGaAsSb/AlGaAsSb material system demonstrates good carrier confinement, with a conduction band offset between ~200–550 meV, and a valence band offset between ~100–300 meV. As mentioned previously, $\Delta E_c \approx 150$ meV and $\Delta E_v \approx 75$ meV for 850 nm GaAs/AlGaAs quantum wells. Therefore, the AlGaAsSb/AlGaAsSb material system exceeds the band offsets in the 850 nm VCSELS, and, in the molecular fractions proposed, should provide sufficient confinement for satisfactory device performance over the temperature range of interest. Incidentally, a 2:1 ratio between $\Delta E_c$ and $\Delta E_v$ is also observed in this case.

Using methods well-known in the art (and similar to the method for determining an appropriate alloy composition for the sample active region of FIGS. 4A–4B), appropriate compositions can be determined for all of the suggested alloys. The following ranges of compositions have been determined to be preferable for a laser's active region:

Quantum Well 1

$$Al_xGa_{1-x}As_ySb_{1-y},$$

where $0 \leq x \leq 0.2$ and $0.4 \leq y \leq 0.65$
AND
Barrier Layer 1

$$Al_sGa_{1-s}As_tSb_{1-t},$$

where $0.1 \leq s \leq 0.7$ and $0.4 \leq t \leq 0.65$
OR $$Al_sGa_tIn_{1-s-t}As,$$

where $0.2 \leq s \leq 1$ and $0.4 \leq t \leq 1$ and $s+t \leq 1$
OR $$Al_sIn_{1-s}As,$$

where $0.35 \leq s \leq 0.65$
Quantum Well 2

$$GaAs_xSb_{1-x},$$

where $0 \leq x \leq 0.2$ or $0.6 \leq x \leq 0.9$
AND
Barrier Layer 2

$$Al_sGa_{1-s}As_tSb_{1-t},$$

where $0.1 \leq s \leq 0.7$ and $0.4 \leq t \leq 0.65$
OR $$Al_sGa_tIn_{1-s-t}As,$$

where $0.2 \leq s \leq 1$ and $0.4 \leq t \leq 1$ and $s+t \leq 1$

OR $$Al_sIn_{1-s}As,$$

where $0.35 \leq s \leq 0.65$

Although the present invention has been described in detail with reference to particular preferred embodiments, persons possessing ordinary skill in the art to which this invention pertains will appreciate that various modifications and enhancements may be made without departing from the spirit and scope of the claims that follow. For example, the active regions described for VCSELs may also be used in other types of lasers, such as edge-emitting diodes.

I claim:

1. A laser device comprising:
    a substrate including InP;
    a first and second mirror stack, the first mirror stack positioned proximate to the substrate;
    a first and second cladding layer, interposing the first and second mirror stack; and
    an active region, interposing the first and second cladding layer, the active region having at least one quantum well and one barrier layer, wherein
        the quantum well includes material selected from the group consisting of $Al_xGa_{1-x}As_ySb_{1-y}$ and $GaAs_xSb_{1-x}$, where x and y have values ranging from greater than 0 to 1, and
        the barrier layer includes material selected from the group consisting of $Al_sGa_{1-s}As_tSb_{1-t}$, $Al_sGa_1In_{1-s-t}As$, or $Al_sIn_{1-s}As$, where s and t have values ranging from 0 to 1.

2. A laser device as in claim 1, wherein the mirror stacks are epitaxially grown.

3. A laser device as in claim 2, wherein the mirror stacks comprise AlGaAsSb.

4. A laser device as in claim 3, wherein the mirror stacks are Distributed Bragg Reflectors.

5. A laser device as in claim 1, wherein the active region emits light at a wavelength between 1.2 $\mu$m and 1.4 $\mu$m, inclusive.

6. A laser device as in claim 5, wherein the active region emits light at a wavelength of 1.310 $\mu$m.

7. A laser device as in claim 1, wherein the quantum well material is $$Al_xGa_{1-x}As_ySb_{1-y},$$

in which $0 \leq x \leq 0.2$ and $0.4 \leq y \leq 0.65$.

8. A laser device as in claim 7, wherein the barrier layer material is $$Al_sGa_{1-s}As_tSb_{1-t},$$

in which $0.1 \leq s \leq 0.7$ and $0.4 \leq t \leq 0.65$.

9. A laser device as in claim 7, wherein the barrier layer material is $$Al_sGa_tIn_{1-s-t}As,$$

in which $0.2 \leq s \leq 1$ and $0.4 \leq t \leq 1$ and $s+t \leq 1$.

10. A laser device as in claim 7, wherein the barrier layer material is $$Al_sIn_{1-s}As,$$

in which $0.35 \leq s \leq 0.65$.

11. A laser device as in claim 1, wherein the quantum well material is $$GaAs_xSb_{1-x},$$

in which $0 \leq x \leq 0.2$ or $0.6 \leq x \leq 0.9$.

12. A laser device as in claim 11, wherein the barrier layer material is $$Al_sGa_{1-s}As_tSb_{1-t},$$

in which $0.1 \leq s \leq 0.7$ and $0.4 \leq t \leq 0.65$.

13. A laser device as in claim 11, wherein the barrier layer material is $Al_sGa_tIn_{1-s-t}As$, in which $0.2 \leq s \leq 1$ and $0.4 \leq t \leq 1$ and $s+t \leq 1$.

14. A laser device as in claim 11, wherein the barrier layer material is $Al_sIn_{1-s}As$, in which $0.35 \leq s \leq 0.65$.

15. A laser device as in claim 1, wherein the laser is a VCSEL.

16. A laser device as in claim 1, wherein the laser is an edge-emitting laser.

17. A laser device as in claim 1, wherein the laser operates between 0–100° C.

* * * * *